United States Patent [19]
Brady et al.

[11] Patent Number: 5,249,733
[45] Date of Patent: Oct. 5, 1993

[54] SOLDER SELF-ALIGNMENT METHODS

[75] Inventors: Michael F. Brady, Morrisville; Rajan D. Deshmukh, Yardley, both of Pa.

[73] Assignee: AT&T Bell Laboratories, Murray Hill, N.J.

[21] Appl. No.: 915,492

[22] Filed: Jul. 16, 1992

[51] Int. Cl.[5] .......................... B23K 1/00; B23K 35/38
[52] U.S. Cl. ................................ 228/180.22; 228/223
[58] Field of Search ............... 228/179, 180.2, 214, 228/219, 223, 254

[56] References Cited

U.S. PATENT DOCUMENTS

| | | | |
|---|---|---|---|
| 4,646,958 | 3/1987 | Howard, Jr. | 228/123 |
| 4,771,929 | 9/1988 | Bahr et al. | 228/180.2 |
| 5,046,658 | 9/1991 | Morris | 228/220 |
| 5,048,746 | 9/1991 | Elliott et al. | 228/180.1 |
| 5,121,874 | 6/1992 | Deambrosio et al. | 228/219 |

OTHER PUBLICATIONS

"Self-Alignment Capability of Controlled-Collapse Chip Joining," L. S. Goldmann, 22nd Electronic Components Conference, Washington, D.C., May 15–17, 1972, pp. 322–339.
"A Novel Flip-Chip Interconnection Technique Using Solder Bumps for High-Speed Photoreceivers," K. Katsura et al., *Journal of Lightwave Technology*, vol. 8, No. 9, Sep. 1990, pp. 1323–1327.
"IR Solder Reflow in Controlled Atmosphere of Air and Nitrogen", A. N. Arslancan, Surface Mount Technology Proceedings, Atlantic City, N.J., Apr. 1990, pp. 301–308.
"Flip-Chip Solder Bond Mounting of Laser Diodes", C. Edge et al., *Electronics Letters*, vol. 27, No. 6, Mar. 14, 1991, pp. 499–501.
"Ozone, Flux Residues, and Fluxless SMT Soldering Using Gases," W. H. Witmer Surface Mount Technology Proceedings, Atlantic City, N.J., Apr. 1990, pp. 309–313.
"Environmentally Clean Wave Solderin," R. A. Trovatao, Jr., Surface Mount Technology Proceedings, Atlantic City, N.J., Apr. 1990, pp. 315–318.
"Passive Laser-Fiber Alignment by Index Method," M. S. Cohen et al., *IEEE Transactions Photonics Technology Letters*, vol. 3, No. 11, Nov. 1991, pp. 985–987.
"Bond Design and Alignment in Flip Chip Solder Bonding," R. A. C. Bache et al., Proceedings 8th International Electronic Packaging Society, Dallas, Tex., Nov. 1988, pp. 830–841.
"Cover Gas Soldering Leaves Nothing to Clean Off PCB Assembly," P. Fodor et al., Electronic Packaging & Production, Apr. 1990, pp. 64–66.
"Self Aligned, Flip Chip Assembly of Photonic Devices with Electrical and Optical Connections," M. J. Wale, IEEE 40th Electronic Components and Technology, vol. 1, May 21–24, 1990, pp. 34–41.
"Optical Interconnection for Advanced Processor Systems: A Review of the ESPIRIT II OLIVES Program," J. W. Parker, *Journal of Lightwave Technology*, Vo. 9, No. 12, Dec. 1991, pp. 1764–1773.
"Fluxless Soldering Using Activated Acid Vapors," D. R. Frear et al., presented at NEPCON West, Anaheim, Calif., Feb. 23–27, 1992, vol. 3, pp. 1704–1714.
"MCNC, Army Develop Fluxless Soldering Process," S. Crum, *Electronic Packaging and Production*, Jun. 1992, p. 11.

*Primary Examiner*—Samuel M. Heinrich
*Attorney, Agent, or Firm*—R. B. Anderson

[57] ABSTRACT

A solder self-alignment process for aligning a semiconductor chip (13) with, and bonding the chip to, a substrate (12) is preformed in an atmosphere rich in gaseous formic acid, at least during the melting step. It is preferred that the formic acid atmosphere be maintained during the self-alignment step and the step of cooling and hardening the solder elements (23). With this feature, one can completely avoid the use of any solid or liquid fluxes and avoid the consequences of such use. Nonetheless, the molten solder elements (23) dependably bond to the bonding surfaces and vertically align themselves.

15 Claims, 3 Drawing Sheets

SOLDER SELF-ALIGNMENT METHODS

TECHNICAL FIELD

This invention relates to solder self-alignment methods and, more particularly, to methods for using solder self-alignment to mount accurately a semiconductor chip on a substrate.

BACKGROUND OF THE INVENTION

The advent of lightwave communications has stimulated an intensive development of methods for assembling photonic devices. Photonic devices are those having both optical and electrical attributes, such as lasers and photodetectors. A complex lightwave communications system may require many photonics devices, each of which must be accurately and dependably mounted in alignment with an optical element such as an optical fiber or a lens. It is important to automate as much as possible the process for assembling such devices and to reduce the operator skill needed for obtaining the requisite alignments.

As described, for example, in the papers, "Self-Alignment Capability of Controlled-Collapse Chip Joining," L. S. Goldmann, *Proceedings of 22nd Electronic Components Conference*, 1972, pp. 332-339 and "A Novel Flip-Chip Interconnection Technique Using Solder Bumps for High-Speed Photoreceivers," K. Katsura et al., *Journal of Lightwave Technology*, Vol. 8, No. 9, September 1990, p. 1323, both hereby incorporated herein by reference, a method known as solder self-alignment can be used to obtain accurately aligned bonding and conductive interconnection of a semiconductor chip such as a photonic device to a substrate. According to the method, a set of bonding pads on the substrate is coated with solder and the semiconductor chip is mechanically placed with corresponding bonding pads overlying the substrate bonding pads. Although final registration is desired to be accurate to within one or two microns, the mechanical placement need be accurate only to within several tens of microns. The assembly is then heated to melt or "reflow" the solder, which causes the solder on each of the substrate bonding pads to gather and to wet to a matching bonding pad of the semiconductor chip. The surface tension of the molten solder element tends to force it to flow such as to distribute itself symmetrically around a vertical axis or plane. This force moves the chip, thereby accurately aligning the chip with the substrate. The chip may, for example, be a photodetector or a laser which is accurately aligned, for example, with an optical fiber bonded to the substrate.

One requirement for the solder self-alignment method is that the solder globule wet the bonding pads to which it adheres. A liquid flux is usually coated on the bonding pads for this purpose, but it is recognized that such flux can cause a number of problems. The flux may, for example, bubble during the solder process which may dislodge the chip or contaminate surfaces of the chip or optical elements to interfere with optical transmission. We have tried to avoid the use of a liquid flux by performing the soldering operation in a reducing atmosphere such as an atmosphere of carbon monoxide or hydrogen but have found that such a substitution is not satisfactory. Our studies have shown that, with such substitutions, the molten solder elements often do not from the aligned symmetrical configurations required for solder self-alignment. Accordingly, there is a continuing long-felt need for improved methods for using solder self-alignment to bond semiconductor chips to substrates.

SUMMARY OF THE INVENTION

We have found that the foregoing problems can be avoided by performing the solder self-alignment process in an atmosphere rich in gaseous formic acid, at least during the melting step. It is preferred that the formic acid atmosphere be maintained during the self-alignment step and the step of cooling and hardening the solder elements. With this feature, one can completely avoid the use of any solid or liquid fluxes and avoid the consequences of such use. Nonetheless, the solder elements dependably bond to the bonding surfaces and align themselves into symmetrical configurations.

These and other objects, features and advantages of the invention will be better understood from a consideration of the following detailed description taken in conjunction with the accompanying drawings.

DETAILED DESCRIPTION

Figure 1:
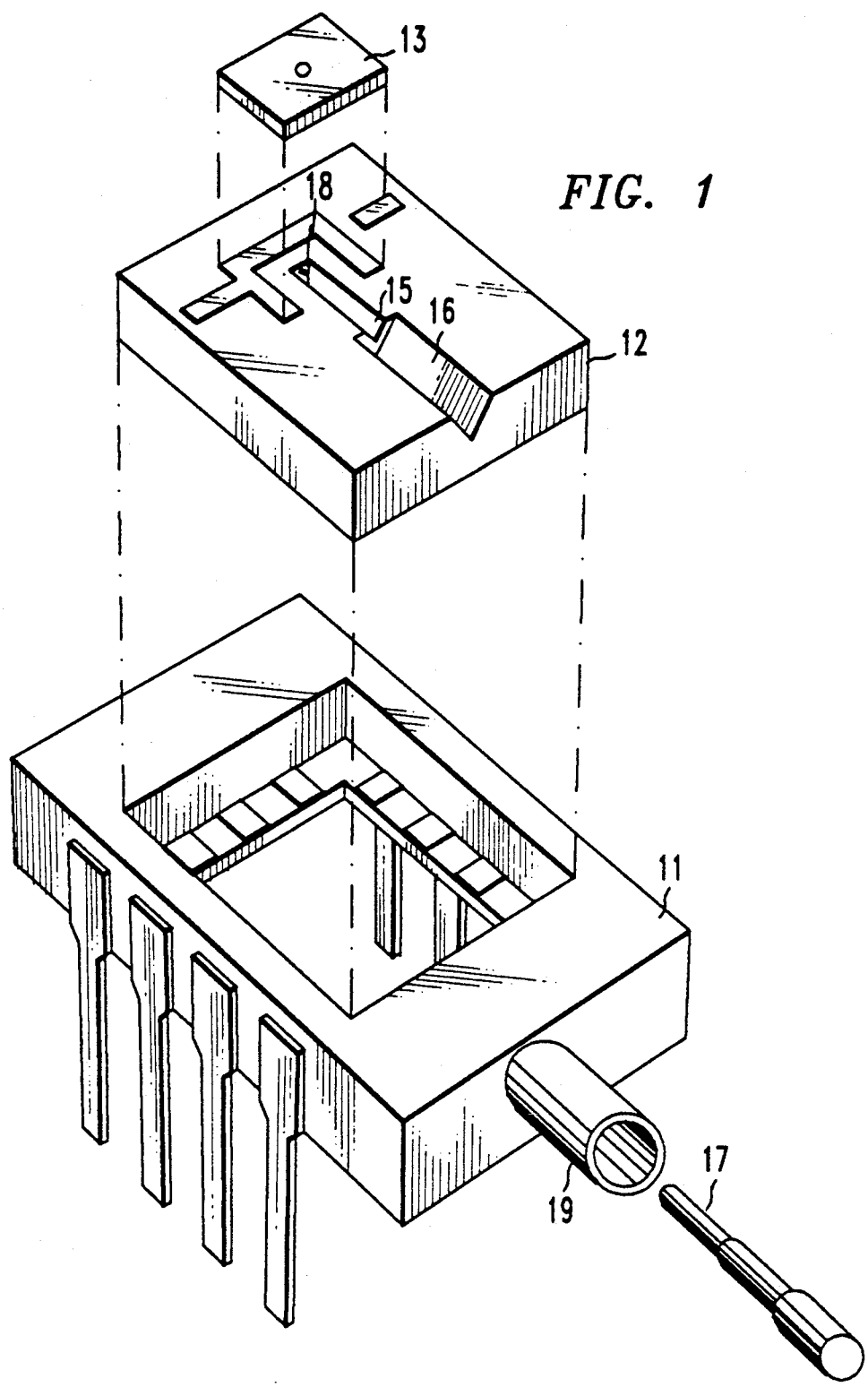
FIG. 1 is a schematic exploded perspective view of a photodetector package to be made in accordance with one embodiment of the invention.

The drawings are not necessarily to scale and certain parts of them have been simplified to aid in clarity of exposition. Referring now to FIG. 1, there is shown illustratively a photonics module of a type that can be assembled in accordance with one embodiment of the invention comprising a ceramic package 11, a silicon submount 12, and a photonics device 13 which is illustratively a semiconductor chip known as a "PIN" photodetector. The submount 12 includes grooves 15 and 16 adapted to support an optical fiber 17. One end of groove 15 is terminated by a mirror 18 which is intended to reflect light from the optical fiber 17 to an active region of the photodetector chip 13. The chip 13 is soldered to bonding pads on the submount 12 such as to be in precise alignment with the the mirror 18. The submount 12 is then mounted in a cavity of the ceramic package 11, which is of a type known as a dual-in-line or a DIP package. The optical fiber is extended through support 19 and bonded within grooves 15 and 16, which aligns the fiber with the mirror 18, and thus with the chip 13.

Figure 2:
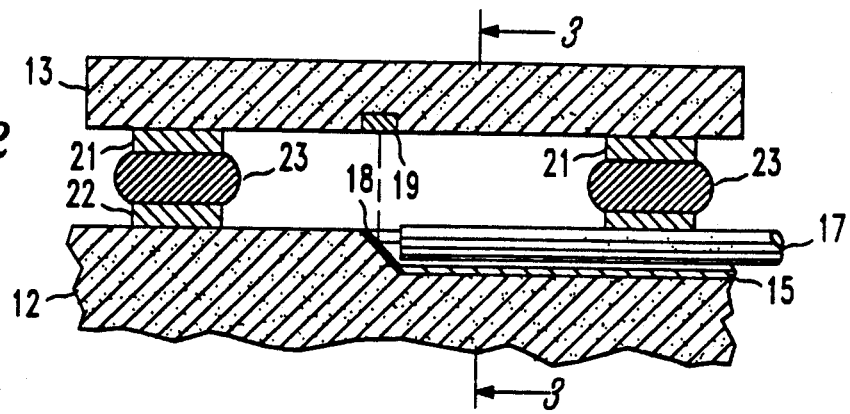
FIG. 2 is a sectional view of part of the photodetector package of FIG. 1.
Figure 3:
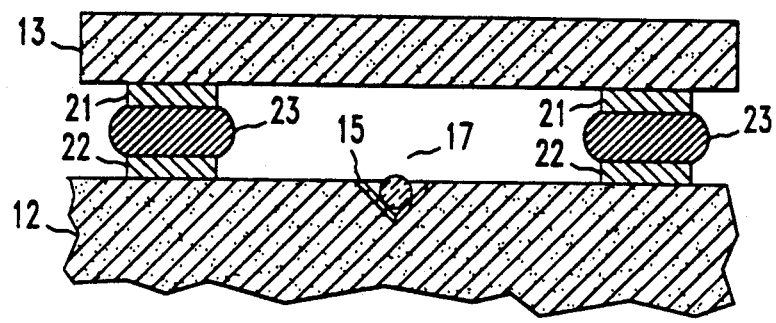
FIG. 3 is a view taken along lines 3—3 of FIG. 2.

The soldering of the photodetector chip 13 to the silicon submount 12 is shown more clearly in FIGS. 2 and 3. The chip has four bonding pads 21 arranged in quadrature and the submount 12 has four bonding pads 22 at locations matching those of the bonding pads 21. The bonding pads are soldered together by solder elements 23 as shown. When properly aligned, light directed along the central axis of optical fiber 17 is reflected from mirror 18 to impinge on an active region 19 of the photodetector 13. Depending on the specific device that is being made, the specifications may require alignment to within tolerances of less than one micron to less than several microns. This high precision is obtained by using the known principles of solder self-alignment, which is illustrated in FIGS. 4 and 5.

Figure 4:
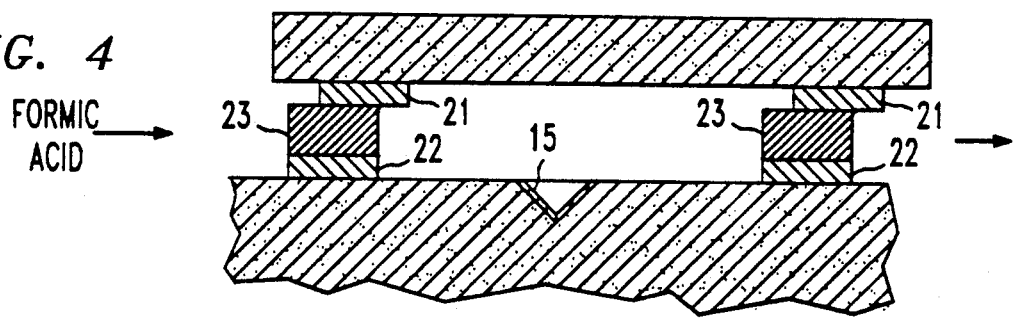
FIGS. 4 and 5 show successive steps in the assembly of the apparatus shown in FIG. 3, in accordance with one embodiment of the invention.

Referring to FIG. 4, bonding pads 22 are initially coated with solder 23. The photodetector chip 13 is then brought into approximate registration by mechanical means which may leave the bonding pads 21 slightly misaligned with respect to bonding pads 22. For example, the bonding pads 21 and 22 may be seventy-five microns on a side and may be initially placed to be registered within fifty to sixty microns of accurate alignment, a typical misalignment being schematically illustrated by the displacement of bonding pads 21 with respect to bonding pads 22. Thereafter, the assembly is heated, causing the solder 23 to gather or ball up due to surface tension. The solder does not wet to the surface of the silicon submount 12 and therefore is contained on bonding pads 22. A "solder dam" may be formed on each bonding pad 22, which is a ring of a material such as titanium to which the solder does not wet, for giving precise solder containment.

Figure 5:
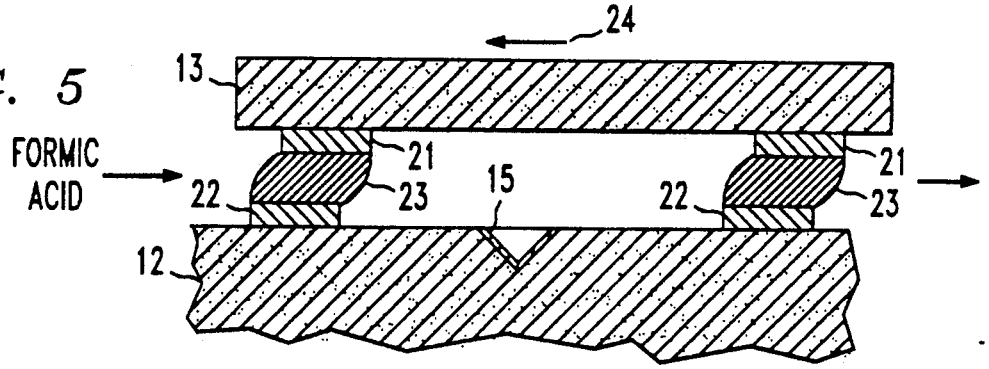

The solder 23 wets bonding pads 21 causing it to assume the shape shown in FIG. 5. The surface tension of the solder 23 inherently causes it to flow toward a vertically aligned configuration which exerts a force on the photodetector element shown by arrow 24. This causes the photodetector chip 13 to become aligned with its bonding pads 21 directly overlying matching bonding pads 22 as shown in FIG. 3. This method for obtaining final alignment adjustment is known as solder self-alignment and it is known that it can routinely be used to obtain alignment accuracy of one or two microns between a semiconductor chip and the substrate on which it is mounted.

Referring again to FIG. 3, a problem with which the invention is concerned is the normal need for a liquid flux to assure bonding of the solder elements 23 to the bonding pads 21 and 22. During the soldering, the liquid flux may boil, bubble and even dislodge chip 13. It can also splatter onto the mirror 16 (FIG. 2) or onto the active region of photodetector chip 13 to cause malfunction of the device.

Referring to FIG. 4, the need for liquid flux is completely eliminated by performing the solder self-alignment method in an atmosphere of gaseous formic acid. The gaseous formic acid aids the wetting of the solder 23 onto the bonding pads 21 and 22 by preventing the formation of thin oxide layers on the bonding pads. Referring to FIG. 5, the formic acid further prevents the formation of microscopic oxide layers on the sidewalls of molten solder elements 23. Our studies have shown that such prevention is important for allowing the transition from the configuration shown in FIG. 5 to that shown in FIG. 3, i.e., for self-alignment. Our experiments using carbon monoxide and hydrogen reducing atmospheres showed a failure or unreliability of the elements 23 to make the transition to the configuration of FIG. 3. We have attributed this problem to the formation of a microscopic oxide layer which changes the surface tension characteristics of the molten solder; this problem is completely avoided with the invention.

Figure 6:
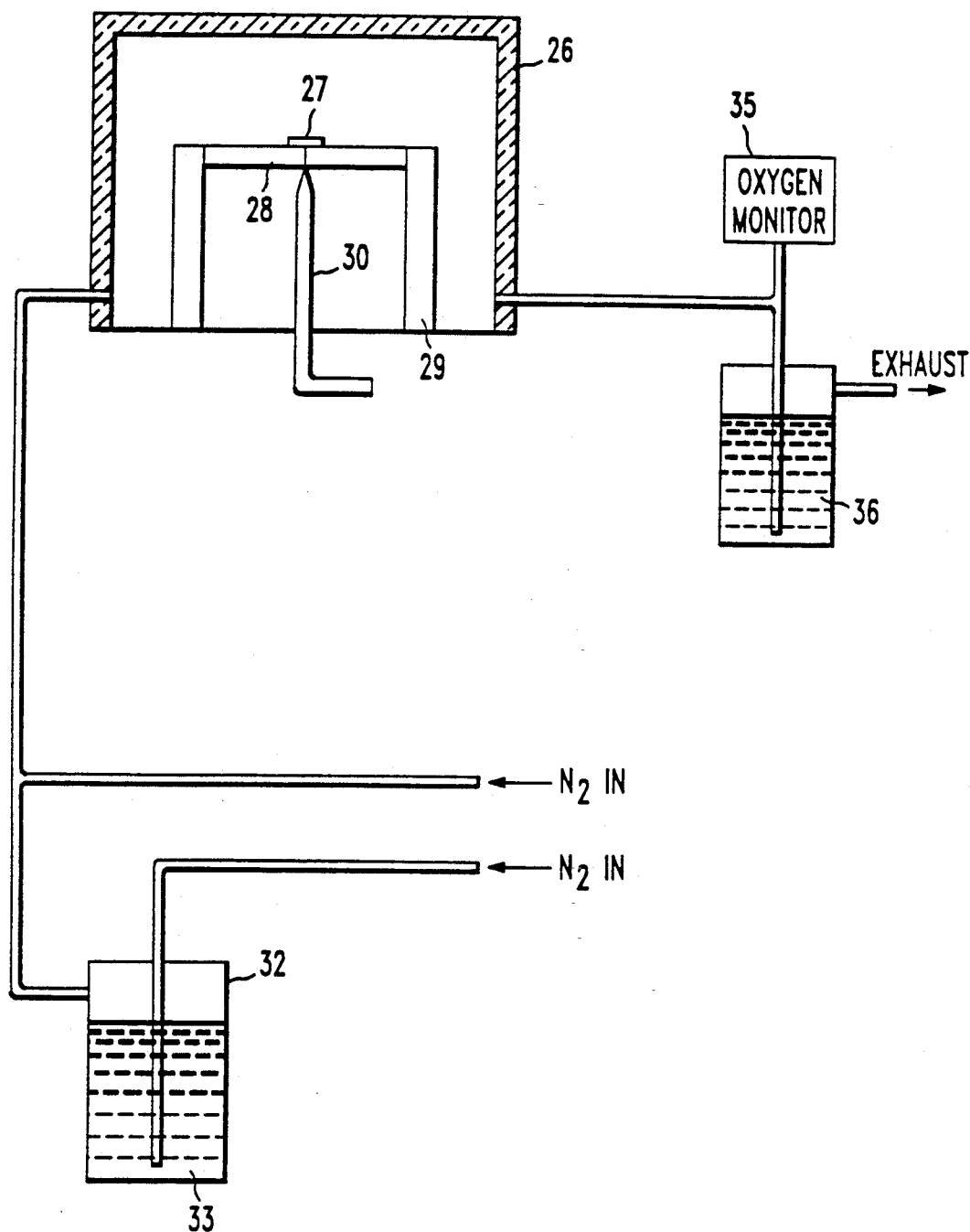
FIG. 6 is a schematic view of apparatus for establishing a vaporized formic acid atmosphere during the process steps illustrated in FIGS. 4 and 5.

Referring to FIG. 6, the experimental self-alignment operation was contained in a bell jar 26. The device assembly 27, comprising the assembly shown in FIG. 4, was supported on a heater 28 having electrodes 29, the temperature of which was monitored by a thermocouple 30. Nitrogen was bubbled through a vessel 32 containing liquid formic acid 33 so that the vaporized formic acid was carried by the nitrogen carrier into the bell jar 26. An oxygen monitor 35 was connected to the gas outlet and the gas was exhausted after being bubbled through a liquid 36. It should be noted that formic acid is quite toxic. Various methods such as decomposition by heat, or reacting with a liquid may therefore be used to control the toxicity of the exhaust. A device for holding the chip above the substrate is not shown in FIG. 6. It should be noted that in commercial applications of the invention, it is expected that robotic placement devices would be used for automatically placing the photodetector chip over the substrate and that batch processing would be used to solder self-align several photodetector chips or other semiconductor chips simultaneously in a single oven.

As is known, the V-grooves 15 and 16 can be made by photolithographic masking and etching with a great deal of accuracy. The mirror surface 16 is preferably metallized as shown. The surfaces of the V-grooves 15 and 16 may or may not be metallized. The metallizations that we used for conductor lines and bonding pads consisted of thin film titanium (one thousand angstroms), platinum (two thousand angstroms) and gold (five thousand angstroms) sputtered by a dc magnetron process in patterns using a molybdenum shadow mask. In this metallization process, the titanium acts as an adhesion layer, the platinum as a barrier and solderable surface, and the gold protects the surface from oxidation. Titanium was then sputtered to define the wettable solder bond pad areas and to provide a solder dam. Last, a five micron layer of gold-tin eutectic solder was deposited on the bonding pad regions through a shadow masking using an electron beam evaporation technique.

Reflow was carried out in a controlled atmosphere having a formic acid vapor concentration of approximately eight hundred to one thousand parts per million. The heater was a graphite strip heater capable of a heating rate of one hundred fifty to two hundred degrees Centigrade per minute. The reflow temperature was three hundred twenty degrees Centigrade.

Although the invention has been discussed in the context of a photodetector module, it is to be understood that it can be used wherever alignment of a semiconductor chip with respect to a substrate is required. "Semiconductor chip" as used herein is intended to include lasers, laser arrays, photodetector arrays, diodes, diode arrays, and integrated circuits. It is possible that the invention may also find utility in aligning such passive devices as lenses with an underlying surface. As is known, the body to be aligned using solder self-alignment must be sufficiently small that it can be moved by the surface tension of a plurality of molten solder elements. It is also possible that a single solder element may be used for self-alignment in accordance with the invention. It is believed that formic acid is effective because it is highly reactive with oxygen and therefore is particularly effective in preventing any oxides on the solder surface during the self-alignment process; however, it is not our intention to be bound by any particular theory of operation. Rather, the invention is based on the experimental determination that using gaseous formic acid, unlike other reducing atmospheres, will result in reliable bonding and self-alignment without resort to any liquid or solid flux of any kind.

Various other embodiments and modifications may be made by those skilled in the art without departing from the spirit and scope of the invention.

We claim:

1. A method for aligning a member with, and bonding the member to, a substrate, comprising the steps of:
    defining a first metal bonding pad on the member and a second metal bonding pad on the substrate, the first and second bonding pads being at predetermined corresponding locations;
    coating at least one of the metal bonding pads with solder;
    approximately registering the first bonding pad in close proximity to the second bonding pad;
    melting the solder to cause the solder to gather and to make contact simultaneously with the first and second bonding pads;
    using solder self-alignment to permit the surface tension of the molten solder to align the member with the substrate;
    and cooling to harden the solder and to bond together the first and second bonding pads; wherein the invention comprises the step of:
    exposing the solder and the bonding pads to an atmosphere rich in gaseous formic acid during at least the melting step.

2. The method of claim 1 wherein:
    the exposing step occurs also during the self-alignment step.

3. The method of claim 2 wherein:
    the exposing step occurs also during the cooling step.

4. The method of claim 3 further comprising the step of:
    bubbling a carrier gas through liquid formic acid to form gaseous formic acid and flowing the gaseous formic acid past the member and the substrate during the melting, self-alignment and cooling steps.

5. The method of claim 4 wherein:
    the carrier gas is substantially pure nitrogen.

6. The method of claim 1 wherein:
    the member is a semiconductor chip.

7. The method of claim 6 wherein:
    the semiconductor chip is a photonic device soldered in alignment with a mirror formed on the substrate; and further comprising the step of:
    bonding to the substrate an optical fiber in alignment with said mirror.

8. The method of claim 1 wherein:
    the first metal bonding pad is one of a first plurality of bonding pads on the member, and the second metal bonding pad is one of a plurality of second metal bonding pads on the substrate, the locations of the second metal bonding pads matching the locations of the first metal bonding pads;
    and solder self-alignment is used to solder bond each of the first bonding pads with a corresponding one of the second bonding pads.

9. The method of claim 8 wherein:
    the exposing step occurs also during the self-alignment step and during the cooling step.

10. The method of claim 9 wherein:
    the element is a photonic device;
    and an optical device to be aligned with the photonic device is bonded to the substrate.

11. The method of claim 10 further comprising the step of:
    bubbling a carrier gas through liquid formic acid to form gaseous formic acid and flowing the gaseous formic acid past the photonic device and the substrate during the melting, self-alignment and cooling steps.

12. A method for aligning and bonding a semiconductor chip to a substrate comprising the steps of:
    defining a first set of metal bonding pads on the semiconductor chip and a second set of metal bonding pads on the substrate, the first and second sets having substantially identical configurations;
    coating at least one set of metal bonding pads with solder;
    locating the semiconductor chip above the substrate such that the first set of bonding pads is in approximate registration with the second set of bonding pads;
    melting the solder to cause the solder to gather and to wet simultaneously the first and second sets of bonding pads;
    permitting the surface tension of the molten solder to align the semiconductor chip with the substrate;
    and cooling to harden the solder and to bond together the first and second sets of bonding pads; wherein the invention comprises the step of:
    flowing vaporized formic acid past the semiconductor chip and substrate during the melting, self-alignment and cooling steps.

13. The method of claim 12 wherein:
    the semiconductor chip is a photonic device;
    and the substrate includes bonded thereon an optical device to be aligned during the self-alignment step with the photonic device.

14. The method of claim 13 wherein:
    the photonic device is a photodetector;
    and the optical device is an optical fiber.

15. The method of claim 14 further comprising the step of:
    bubbling a carrier gas through liquid formic acid to form vaporized formic acid and directing the vaporized formic acid to an enclosure containing the semiconductor chip and substrate.

* * * * *